United States Patent
Okato

(10) Patent No.: US 12,228,853 B2
(45) Date of Patent: Feb. 18, 2025

(54) REFLECTIVE MASK BLANK, REFLECTIVE MASK, AND MANUFACTURING METHOD

(71) Applicant: AGC Inc., Tokyo (JP)

(72) Inventor: Takeshi Okato, Tokyo (JP)

(73) Assignee: AGC INC., Tokyo (JP)

( * ) Notice: Subject to any disclaimer, the term of this patent is extended or adjusted under 35 U.S.C. 154(b) by 0 days.

(21) Appl. No.: 18/820,061

(22) Filed: Aug. 29, 2024

(65) Prior Publication Data

US 2024/0419063 A1     Dec. 19, 2024

Related U.S. Application Data

(63) Continuation of application No. PCT/JP2023/008186, filed on Mar. 3, 2023.

(51) Int. Cl.
    *G03F 1/24*     (2012.01)

(52) U.S. Cl.
    CPC ........................... *G03F 1/24* (2013.01)

(58) Field of Classification Search
    CPC ............................................. G03F 1/24
    USPC ............................................. 430/5
    See application file for complete search history.

(56) References Cited

U.S. PATENT DOCUMENTS

| | | |
|---|---|---|
| 2018/0299766 A1 | 10/2018 | Tanabe |
| 2019/0146325 A1 | 5/2019 | Hsueh et al. |
| 2020/0133114 A1 | 4/2020 | Jindal et al. |
| 2022/0163879 A1 | 5/2022 | Tanabe |

FOREIGN PATENT DOCUMENTS

| | | |
|---|---|---|
| JP | 2015-008283 A | 1/2015 |
| JP | 2018-169617 A | 11/2018 |
| JP | 2018-180544 A | 11/2018 |
| JP | 2022-505688 A | 1/2022 |

OTHER PUBLICATIONS

International Searching Authority, "International Search Report," issued in connection with International Patent Application No. PCT/JP2023/008186 dated Apr. 11, 2023.

International Searching Authority, "Written Opinion," issued in connection with International Patent Application No. PCT/JP2023/008186 dated Apr. 11, 2023.

*Primary Examiner* — Christopher G Young

(74) *Attorney, Agent, or Firm* — Foley & Lardner LLP

(57) ABSTRACT

A reflective mask blank, which is a binary reflective mask blank, includes, in order: a substrate; a multilayer reflective film configured to reflect EUV light; and a pattern film. The pattern film has a laminated structure including a total of L layers each having a different refractive index where L is a natural number of 2 or more. When an absorption coefficient of an i-th layer in the pattern film from a side opposite to the substrate is defined as $k_i$, a thickness of the i-th layer in the pattern film from the side opposite to the substrate is defined as $d_i$ (nm), a total thickness of the pattern film is defined as d, an exposure wavelength is defined as $\lambda$ (nm), and $P_i$ is defined as $1-\exp(-2\pi/\lambda * d_i k_i)$, the following formula (1) is satisfied.

$$\sum_{i=1}^{L}(P_i/d) > 0.0120 \quad (1)$$

11 Claims, 5 Drawing Sheets

REFLECTIVE MASK BLANK, REFLECTIVE MASK, AND MANUFACTURING METHOD

CROSS-REFERENCE TO RELATED APPLICATIONS

This is a bypass continuation of International Patent Application No. PCT/JP2023/008186, filed on Mar. 3, 2023, which claims priority to Japanese Patent Application No. 2022-035462, filed on Mar. 8, 2022. The contents of these applications are hereby incorporated by reference in their entireties.

TECHNICAL FIELD

The present invention relates to a reflective mask blank, and a reflective mask and a production method therefor, particularly to a reflective mask blank for EUV lithography, which is an unpatterned plate for producing an extreme ultra violet (EUV) exposure mask for use in an exposure process in semiconductor production, and a reflective mask obtained by forming a mask pattern on a pattern film of the reflective mask blank for EUV lithography, and a production method therefor.

BACKGROUND ART

In the related art, ultraviolet light having a wavelength of 193 nm to 365 nm has been used for a light source for an exposure apparatus for use in semiconductor production. The shorter the wavelength, the higher the resolution of the exposure apparatus. Therefore, EUV light having a central wavelength of 13.5 nm is regarded as a promising light source for the next generation of exposure apparatus.

Since the EUV light is easily absorbed by many substances, it is not possible to use an exposure apparatus with a refractive optical system. Therefore, a reflective mask is used for the EUV light.

In such a reflective mask, a multilayer reflective film that reflects the EUV light is formed on a substrate, and an absorber film that absorbs the EUV light is patterned on the multilayer reflective film. In general, a protective film (also referred to as a "cap layer") for protecting the multilayer reflective film from etching in forming a mask pattern is formed between the multilayer reflective film and the absorber film. Further, in order to facilitate inspection of pattern defects after mask processing, a low reflection layer may be formed on the absorber film.

As the substrate, a low thermal expansion glass, which is synthetic quartz doped with a small amount of titanium, can be used for the purpose of preventing pattern distortion due to thermal expansion during exposure. As the multilayer reflective film, a film in which a molybdenum (Mo) film and a silicon film are alternately laminated for about 40 cycles can be used. The protective film may be made of a ruthenium-based material having a thickness of 1 nm to 5 nm. The ruthenium (Ru)-based material is very difficult to etch with a gas that does not contain oxygen, and functions as an etching stopper during mask processing. The absorber film may be made of a tantalum-based material.

EUV light incident on the reflective mask from an illumination optical system of the exposure apparatus is reflected in openings where there is no absorber film and is absorbed in non-openings where there is an absorber film, and the mask pattern is transferred onto a wafer through a reduction projection optical system of the exposure apparatus. The EUV light is generally incident on the reflective mask from a direction tilted by 6 degrees. When the absorber film has a large thickness, some portions are shaded by the absorber film, making it not possible to faithfully transfer the mask pattern onto the wafer. This problem is more pronounced as a line width of the mask pattern is smaller, so that there is a demand for reducing the thickness of the absorber film.

In addition, in the case of a binary mask, in order to perform highly accurate pattern transfer in EUV exposure, it is necessary to reduce a reflectance in the non-openings to 2% or less.

In Patent Literature 1, by forming a surface reflection enhancing film that is optically designed to satisfy certain conditions on an absorber film, an amplitude of EUV light reflected from a surface of a pattern film that is partially etched during mask processing is increased, and by using an interference effect with EUV light reflected by a multilayer reflective film, a thickness of the absorber film can be reduced and a reflectance in non-openings can be reduced to 2% or less. Note that, the pattern film is composed of the absorber film and the surface reflection enhancing film.

In addition, Patent Literature 2 discloses a reflective mask blank including, as an absorber film, a laminated film in which a low refractive index material film and a high refractive index material film are alternately laminated in multiple cycles.

CITATION LIST

Patent Literature

Patent Literature 1: JP2018-180544A
Patent Literature 2: JP2015-8283A

SUMMARY OF INVENTION

Technical Problem

However, generally, since an absolute value of a refractive index difference Δn between adjacent layers in a laminated structure of the pattern film in the reflective mask blank is small, the amplitude (intensity) of the EUV light reflected at an interface of the laminated structure of the pattern film is remarkably smaller than the amplitude (intensity) of the light reflected from the multilayer reflective film. Therefore, relying solely on the interference effect, in which the EUV light reflected at the interface of the laminated structure of the pattern film is used to cancel out the light reflected from the multilayer reflective film, there is a limit to achieve the pattern film having a reduced thickness and a smaller reflectance for the EUV light.

In addition, in Patent Literature 2, in the case of etching or cleaning the laminated film, which is the absorber film, for mask processing, there is a problem that damage occurs to a sidewall of the laminated film.

An object of the present invention is to provide a reflective mask blank that can have a sufficiently small reflectance of a pattern film while having a small thickness of the pattern film, and a reflective mask and a production method therefor. More specifically, an object of the present invention is to provide a reflective mask blank that can achieve a reflectance of 1% or less at a thickness of a pattern film of 45 nm or less, and a reflective mask and a production method therefor.

Solution to Problem

As a result of intensive research to solve the above problems, the inventors of the present invention have found that, in a reflective mask blank including, in order, a substrate, a multilayer reflective film configured to reflect EUV light, and a pattern film having a laminated structure having a total of L layers each having a different refractive index, when the pattern film satisfies the following formula (1), the above problems can be solved. Thus, the present invention has been completed.

[Math. 1]

$$\sum_{i=1}^{L}(P_i/d) > 0.0120 \quad (1)$$

That is, the present invention is as follows.

[1] A reflective mask blank, which is a binary reflective mask blank, including, in order: a substrate; a multilayer reflective film configured to reflect EUV light; and a pattern film, in which the pattern film has a laminated structure having a total of L layers each having a different refractive index (where L is a natural number of 2 or more), and when an absorption coefficient of an i-th layer in the pattern film from a side opposite to the substrate is defined as $k_i$, a thickness of the i-th layer in the pattern film from the side opposite to the substrate is defined as $d_i$ (nm), a total thickness of the pattern film is defined as d, an exposure wavelength is defined as $\lambda$ (nm), and $P_i$ is defined as $1-\exp(-2\pi/\lambda * d_i k_i)$, the following formula (1) is satisfied.

[Math. 2]

$$\sum_{i=1}^{L}(P_i/d) > 0.0120 \quad (1)$$

[2] The reflective mask blank according to the above [1], in which when a reflection amplitude of the i-th layer in the pattern film from the side opposite to the substrate is defined as $r_i$, the following formula (2) is satisfied.

[Math. 3]

$$\sum_{i=1}^{L}(r_i) \geq 0.080 \quad (2)$$

[3] The reflective mask blank according to the above [1], in which an outermost layer in the pattern film, which is the first layer from the side opposite to the substrate, has a refractive index $n_1$ of 0.950 or less.

[4] The reflective mask blank according to the above [1], in which at least one of differences |Δk| in absorption coefficient k between two adjacent layers in the pattern film is 0.0200 or more.

[5] The reflective mask blank according to the above [1], in which when a refractive index of the i-th layer in the pattern film from the side opposite to the substrate is defined as $n_i$, a thickness $d_1$ of an outermost layer in the pattern film, which is the first layer from the side opposite to the substrate, satisfies the following formula (3).

$$|(\lambda/4n_1+\lambda/2n_1*x)-d_1|<2.50 \quad (3)$$

In the formula (3), x is an integer of 0 or more.

[6] The reflective mask blank according to the above [1], in which the pattern film has a reflectance of 1.3% or less.

[7] The reflective mask blank according to the above [1], in which the pattern film has a reflectance of 1% or less.

[8] The reflective mask blank according to the above [1], in which the pattern film has a total thickness d of 45 nm or less.

[9] The reflective mask blank according to the above [1], further including a protective film between the multilayer reflective film and the pattern film.

[10] A reflective mask including: a pattern formed by patterning the pattern film in the reflective mask blank according to any one of the above [1] to [9].

[11] A method for producing a reflective mask including patterning the pattern film in the reflective mask blank according to any one of the above [1] to [9].

Advantageous Effects of Invention

According to the present invention, it is possible to provide a reflective mask blank that can have a sufficiently small reflectance of a pattern film while having a small thickness of the pattern film, and a reflective mask and a production method therefor.

Since the reflective mask blank according to the present invention has a simple film structure, mask processing is also easy.

DESCRIPTION OF EMBODIMENTS

In the present description, the definitions and meanings of terms are as follows.

In the present description, anything that is considered to be preferred can be adopted, and a combination of preferred things is more preferred.

In addition, in the present description, the description "XX to YY" means "XX or more and YY or less".

In addition, in the description of the present application, "exp(t)" means "et".

Further, in the present description, regarding preferred numerical ranges (for example, ranges of content or the like), lower limit and upper limit values described in stages can be combined independently. For example, based on the description "preferably 10 to 90, more preferably 30 to 60", the "preferred lower limit value (10)" and the "more preferred upper limit value (60)" can be combined to form "10 to 60". In addition, a numerical range described in the present description, an upper limit value or a lower limit value of the numerical range may be replaced with values described in Examples.

[Reflective Mask Blank]

A reflective mask blank according to the present embodiment includes, in order, a substrate, a multilayer reflective film that reflects EUV light, and a pattern film, and further includes other layers such as a protective film, if necessary.

The pattern film is a layer that is partially etched during mask processing, and includes an absorber film. The pattern film may include a buffer layer or a low reflection layer in addition to the absorber film.

The reflective mask blank according to the present embodiment is a binary reflective mask blank in which the multilayer reflective film reflects the EUV light in openings where there is no absorber film and the pattern film reduces the reflection of the EUV light in non-openings where there is an absorber film.

Figure 1:
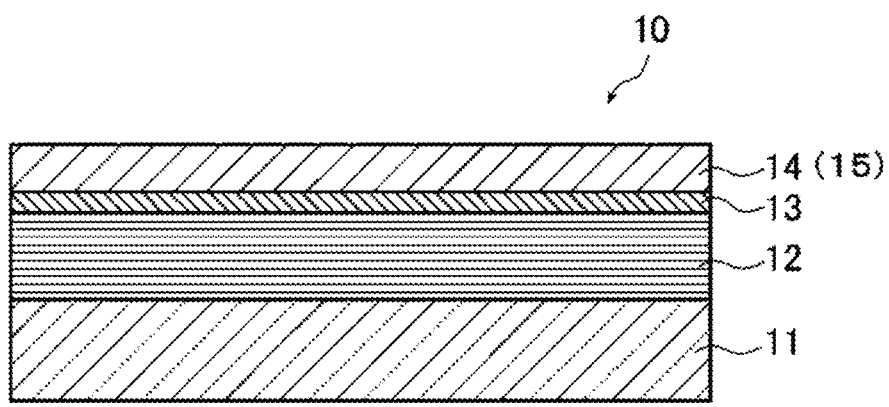
FIG. 1 is a schematic cross-sectional view showing an example of an embodiment of a reflective mask blank according to the present invention.

FIG. 1 is a schematic cross-sectional view showing an example of an embodiment of a reflective mask blank according to the present invention. A reflective mask blank 10 shown in FIG. 1 includes a multilayer reflective film 12, a protective film 13, and an absorber film 14 as a pattern film 15 formed in order on or above a substrate 11.

<Substrate>

The substrate 11 satisfies characteristics as a substrate for an EUV mask blank. Therefore, the substrate 11 has a low thermal expansion coefficient (specifically, a thermal expansion coefficient at 20° C. of preferably $0\pm0.05\times10^{-7}/°$ C., and more preferably $0\pm0.03\times10^{-7}/°$ C.), and is excellent in smoothness, flatness, and resistance to a cleaning liquid for use in cleaning a mask blank or a photomask after pattern formation. As the substrate 11, specifically, a glass having a low thermal expansion coefficient, for example, a $SiO_2$—$TiO_2$-based glass is used, but the substrate 11 is not limited thereto. A substrate made of a crystallized glass in which a β-quartz solid solution is precipitated, a quartz glass, silicon, a metal, or the like can also be used.

It is preferable that the substrate 11 have a smooth surface having a surface roughness (rms) of 0.15 nm or less and have a flatness of 100 nm or less since a high reflectance and transfer accuracy can be obtained in a photomask after pattern formation.

A size, thickness, and the like of the substrate 11 are appropriately determined according to design values and the like of the mask.

It is preferable that no defect be present on a surface of the substrate 11 on which the multilayer reflective film 12 is formed. However, even in the case where defects are present, recessed defects and/or protruding defects should not generate phase defects. Specifically, a depth of a recessed defect and a height of a protruding defect are preferably 2 nm or less, and a half width of the recessed defect and the protruding defect is preferably 60 nm or less. The half width of the recessed defect refers to a width at a depth position that is ½ of the depth of the recessed defect. The half width of the protruding defect refers to a width at a height position that is ½ of the height of the protruding defect.

<Multilayer Reflective Film>

The multilayer reflective film 12 reflects the EUV light and achieves a high EUV light reflectance by alternately laminating a high refractive index layer and a low refractive index layer a plurality of times. In the multilayer reflective film 12, Mo is widely used for the high refractive index layer, and Si is widely used for the low refractive index layer. That is, a Mo/Si multilayer reflective film is the most common.

The multilayer reflective film 12 is not particularly limited as long as it has desired characteristics as a reflection layer in the reflective mask blank. Here, the characteristic particularly required for the multilayer reflective film 12 is a high EUV light reflectance. Specifically, when the surface of the multilayer reflective film 12 is irradiated with light in a wavelength region of EUV light at an incident angle of 6 degrees, a peak reflectance of light in the EUV wavelength region (that is, a maximum value of light reflectance near a wavelength of 13.5 nm, and hereinafter, referred to as a "peak reflectance of the EUV light" in the description of the present application) is preferably 60% or more, and more preferably 65% or more. In addition, even in the state where the protective film 13 is provided on the multilayer reflective film 12, the peak reflectance of the EUV light is preferably 60% or more, and more preferably 65% or more.

A thickness of each of the layers constituting the multilayer reflective film 12 and the number of repeating units of the layer can be appropriately selected according to a film material to be used and the EUV light reflectance required for the reflection layer. Taking the Mo/Si multilayer reflective film as an example, in order to obtain the multilayer reflective film 12 in which the maximum value of the EUV light reflectance is 60% or more, for example, the multilayer reflective film may be formed by laminating a Mo layer having a thickness of 2.3 nm±0.1 nm and a Si layer having a thickness of 4.5 nm±0.1 nm to have the number of repeating units of 30 to 60.

The thickness of the multilayer reflective film 12 can be measured, for example, by using a transmission electron microscope (TEM) on a cross section cut along a thickness direction (Z direction) of the reflective mask blank.

In order to prevent oxidation of the surface of the multilayer reflective film 12, it is preferable that the uppermost layer of the multilayer reflective film 12 be a layer made of a hardly oxidized material. The layer made of a hardly oxidized material functions as a cap layer for the multilayer reflective film 12. Specific examples of the layer made of a hardly oxidized material and functioning as a cap layer include a Si layer. In the case where the multilayer reflective film 12 is a Mo/Si multilayer reflective film, the uppermost layer functions as a cap layer by using the Si layer as the uppermost layer. In this case, a thickness of the cap layer is preferably 11±2 nm.

The thickness of the cap layer can be measured, for example, by using a transmission electron microscope (TEM) on the cross section cut along the thickness direction (Z direction) of the reflective mask blank.

<Protective Film>

The protective film 13 is any layer provided for the purpose of protecting the multilayer reflective film 12 such that, during pattern formation on the absorber film 14 by an etching process, generally by a dry etching process, the multilayer reflective film 12 is not damaged by the etching process. Therefore, as a material of the protective film 13, a material which is hardly influenced by the etching process for the absorber film 14, that is, a material which has an etching rate slower than that of the absorber film 14 and which is hardly damaged by this etching process is selected. In order to satisfy the above characteristics, the protective film 13 preferably contains at least one of Rh and Ru (a Ru alloy, a Rh alloy, or the like).

More specifically, examples of the material include a Ru metal simple substance, a Ru alloy containing Ru and one or more metals selected from the group consisting of Si, Ti, Nb, Mo, Rh, and Zr, a Rh metal simple substance, a Rh alloy containing Rh and one or more metals selected from the group consisting of Si, Ti, Nb, Mo, Ru, Ta, and Zr, and a Rh-based material such as a Rh-containing nitride containing the Rh alloy and N, and a Rh-containing oxynitride containing the Rh alloy, N, and O.

In addition, examples of the material that can achieve the above purpose include a nitride containing Al, N, and the above metals, and $Al_2O_3$.

Among them, a Ru metal simple substance, a Ru alloy, a Rh metal simple substance, or a Rh alloy is preferred as the material that can achieve the above purpose. The Ru alloy is preferably a Ru—Si alloy or a Ru—Rh alloy, and the Rh alloy is preferably a Rh—Si alloy or a Rh—Ru alloy.

A thickness of the protective film 13 is preferably 1 nm to 10 nm, and more preferably 1 nm to 5 nm.

The thickness of the protective film 13 can be measured, for example, by using a transmission electron microscope (TEM) on the cross section cut along the thickness direction (Z direction) of the reflective mask blank.

The protective film may be a film composed of a single layer or a multilayer film composed of a plurality of layers. In the case where the protective film is a multilayer film, each layer constituting the multilayer film is preferably made of the above preferred material. In addition, in the case where the protective film is a multilayer film, a total thickness of the multilayer film is preferably the thickness of the protective film within the above preferred range.

The protective film can be formed by a known film forming method such as a magnetron sputtering method and an ion beam sputtering method. In the case where a Ru film is formed by a magnetron sputtering method, it is preferable to perform film formation by using a Ru target as a target and an Ar gas as a sputtering gas.

<Absorber Film>

The characteristics particularly required for the binary absorber film 14 is an extremely low EUV light reflectance. Specifically, the peak reflectance of the EUV light when the surface of the absorber film 14 is irradiated with light in the wavelength region of EUV light is preferably 1.3% or less, more preferably 1% or less, still more preferably 0.98% or less, particularly preferably 0.50% or less, and most preferably 0.30% or less.

Note that, the reflectance of the absorber film 14 can be measured, for example, by using an EUV reflectometer.

In order to achieve the above characteristics, the absorber film 14 is made of a material having a high EUV light absorption coefficient. The material having a high EUV light absorption coefficient is preferably a material containing tantalum (Ta) as a main component. In the description of the present application, a material containing tantalum (Ta) as a main component means a material containing 20 at % or more of Ta in the material.

The material containing Ta as a main component for use in the absorber film 14 preferably contains, in addition to Ta, at least one component of hafnium (Hf), Si, zirconium (Zr), germanium (Ge), boron (B), palladium (Pd), tin (Sn), chromium (Cr), manganese (Mn), iron (Fe), cobalt (Co), silver (Ag), cadmium (Cd), indium (In), antimony (Sb), tungsten (W), rhenium (Re), osmium (Os), iridium (Ir), platinum (Pt), gold (Au), thallium (Tl), lead (Pb), bismuth (Bi), carbon (C), titanium (Ti), Mo, Ru, rhodium (Rh), calcium (Ca), magnesium (Mg), Al, nickel (Ni), copper (Cu), zinc (Zn), gallium (Ga), arsenic (As), selenium (Se), tellurium (Te), hydrogen (H), and nitrogen (N). Specific examples of the material containing the above elements in addition to Ta include TaN, TaNH, TaHf, TaHfN, TaBSi, TaBSiN, TaB, TaBN, TaSi, TaSiN, TaGe, TaGeN, TaZr, TaZrN, TaPd, TaSn, TaPdN, TaSn, TaCr, TaMn, TaFe, TaCo, TaAg, TaCd, TaIn, TaSb, and TaW.

The absorber film 14 preferably has a thickness of 20 nm to 90 nm.

Note that, the thickness of the absorber film 14 can be measured, for example, by using a transmission electron microscope (TEM) on the cross section cut along the thickness direction (Z direction) of the reflective mask blank.

<Pattern Film>

The pattern film including the above absorber film has a laminated structure having a total of L layers each having a different refractive index (where L is a natural number of 2 or more).

L is not particularly limited as long as it is a natural number of 2 or more, and is preferably 8 or less, more preferably 6 or less, and still more preferably 5 or less. That is, L is, for example, 2 to 8.

Preferred examples of the pattern film include a "two-layer structure including a TaN film (on a substrate side) and a Pt film (on a side opposite to the substrate)", a "two-layer structure including a Cr film (on the substrate side) and a Ru film (on the side opposite to the substrate)", a "three-layer structure including a Cr film (on the substrate side), a Si film, and a Cr film (on the side opposite to the substrate)", and a "two-layer structure including a $SnO_2$ film (on the substrate side) and a Ru film (on the side opposite to the substrate)".

In the reflective mask blank according to the present embodiment, in the case where a refractive index of an i-th layer (i is a natural number) in the pattern film from the side opposite to the substrate is defined as $n_i$, an absorption coefficient of the i-th layer in the pattern film from the side opposite to the substrate is defined as $k_i$, a thickness of the i-th layer in the pattern film from the side opposite to the substrate is defined as $d_i$ (nm), a total thickness of the pattern film is defined as d, an exposure wavelength is defined as $\lambda$ (nm), and $P_i$ is defined as $1-\exp(-2\pi/\lambda * d_i k_i)$, the following formula (1) is satisfied, the following formula (1-1) is preferably satisfied, and the following formula (1-2) is more preferably satisfied.

When the formula (1) is satisfied, it is possible to obtain a reflective mask blank that can have a sufficiently small reflectance of the pattern film while having a small thickness of the pattern film. Note that, the refractive index $n_i$ and the absorption coefficient $k_i$ are values at a wavelength of 13.5 nm, for example.

[Math. 4]
$$\sum_{i=1}^{L}(P_i/d) > 0.0120 \quad (1)$$

[Math. 5]
$$0.300 > \sum_{i=1}^{L}(P_i/d) > 0.0121 \quad (1-1)$$

[Math. 6]
$$0.250 > \sum_{i=1}^{L}(P_i/d) > 0.0123 \quad (1-2)$$

In the case where a reflection amplitude of the i-th layer in the pattern film from the side opposite to the substrate is defined as $r_i$, from the viewpoint of using the cancellation of reflected waves, the following formula (2) is preferably satisfied, the following formula (2-1) is more preferably satisfied, and the following formula (2-2) is particularly preferably satisfied.

Note that, a reflection amplitude $r_L$ of the L-th layer in the pattern film from the side opposite to the substrate is calculated using $|(n_{L-1}-n_L)/(n_{L-1}+n_L)|$.

[Math. 7]
$$\sum_{i=1}^{L}(r_i) \geq 0.080 \quad (2)$$

[Math. 8]
$$0.200 \geq \sum_{i=1}^{L}(r_i) \geq 0.081 \quad (2-1)$$

[Math. 9]
$$0.120 \geq \sum_{i=1}^{L}(r_i) \geq 0.082 \quad (2-2)$$

A refractive index $n_1$ of the outermost layer in the pattern film, which is the first layer from the side opposite to the substrate, is not particularly limited. The refractive index $n_1$ is preferably 0.950 or less, more preferably 0.945 or less, and particularly preferably 0.940 or less, from the viewpoint of generating a reflection amplitude at an interface with a vacuum, and is preferably 0.830 or more, more preferably 0.860 or more, and particularly preferably 0.870 or more, from the viewpoint of using the cancellation of reflected waves by the reflection amplitudes of materials of the outermost layer and the second layer.

The refractive index $n_1$ and the thickness $d_1$ of the outermost layer in the pattern film, which is the first layer from the side opposite to the substrate, preferably satisfy the following formula (3), more preferably satisfy the following formula (3-1), and particularly preferably satisfy the following formula (3-2).

$$|(\lambda/4n_1+\lambda/2n_1*x)-d_1|<2.50 \quad (3)$$

$$0.10<(\lambda/4n_1+\lambda/2n_1*x)-d_1|<2.30 \quad (3-1)$$

$$0.20<(\lambda/4n_1+\lambda/2n_1*x)-d_1|<2.10 \quad (3-2)$$

In the formulae (3), (3-1) and (3-2), x is an integer of 0 or more.

A difference $|\Delta k|$ in absorption coefficient k of two adjacent layers in the pattern film is not particularly limited. At least one of differences $|\Delta k|$ is preferably 0.0200 or more, more preferably 0.0210 or more, and particularly preferably 0.0220 or more, from the viewpoint of using the cancellation of reflected waves. On the other hand, the difference $|\Delta k|$ is not particularly limited in upper limit value, and is preferably 0.0700 or less, more preferably 0.0600 or less, and particularly preferably 0.0550 or less.

The reflectance of the pattern film is not particularly limited so long as it is sufficiently reduced, and is preferably 1.3% or less, more preferably 1% or less, still more preferably 0.98% or less, particularly preferably 0.50% or less, and most preferably 0.30% or less.

Note that, the reflectance of the pattern film can be measured by using an EUV reflectometer, and an optical multilayer film simulation can be performed.

The total thickness d of the pattern film is not particularly limited so long as it is sufficiently reduced, and is preferably 45 nm or less, more preferably 43 nm or less, still more preferably 42 nm or less, and particularly preferably 41 nm or less.

The total thickness of the pattern film can be measured, for example, by using a transmission electron microscope (TEM) on the cross section cut along the thickness direction (Z direction) of the reflective mask blank.

<Buffer Layer>

In the reflective mask blank according to the present invention, a buffer layer may be formed between the protective film 13 and the absorber film 14.

The buffer layer is a layer that protects the multilayer reflective film when dry etching and defect repair are performed.

A material of the buffer layer is not particularly limited, and examples thereof include $SiO_2$ and CrN.

<Low Reflection Layer>

In the reflective mask blank according to the present embodiment, a low reflection layer may be formed on the absorber film 14.

The low reflection layer is formed of a film having low reflection under inspection light used for the mask pattern inspection. When preparing a reflective mask, a pattern is formed on the absorber film, and then whether the pattern is formed as designed is inspected. In the mask pattern inspection, an inspection machine with a light of about 193 nm and 257 nm as the inspection light is generally used. That is, the inspection is performed based on a difference in reflectance of the light of about 193 nm and 257 nm, specifically, a difference in reflectance between a surface exposed by removing the absorber film in the pattern formation and a surface of the absorber film remaining without being removed in the pattern formation. Here, the former is the surface of the protective film. Therefore, in the case where the difference in reflectance between the surface of the protective film and the surface of the absorber film for the wavelength of the inspection light is small, a contrast during the inspection deteriorates, and accurate inspection cannot be performed. In the case where the difference in reflectance between the surface of the protective film and the surface of the absorber film for the wavelength of the inspection light is small, the contrast during the inspection is good by forming the low reflection layer.

A material of the low reflection layer is not particularly limited, and examples thereof include tantalum oxynitride. Since the low reflection layer corresponds to the outermost layer in the pattern film, which is the first layer from the side opposite to the substrate, the low reflection layer preferably satisfies the formula (3).

[Reflective Mask]

A reflective mask according to the present embodiment includes a pattern formed by patterning the pattern film in the reflective mask blank according to the present invention. That is, the reflective mask according to the present embodiment includes, in order, a substrate, a multilayer reflective film that reflects EUV light, and a pattern formed by patterning a pattern film, and further includes other layers such as a protective film, if necessary.

The layers other than the pattern (the substrate, multilayer reflective film, and other layers such as a protective film) are as described for the reflective mask blank.

The pattern is described in the "Method for Producing Reflective Mask" to be described later.

[Method for Producing Reflective Mask]

In a method for producing a reflective mask according to the present embodiment, the pattern film in the reflective mask blank according to the present embodiment is patterned. That is, the reflective mask according to the present embodiment can be prepared by using the above reflective mask blank according to the present embodiment. In the production of a reflective mask for EUV lithography, photolithography, which allows high definition patterning, is most suitable.

In the present embodiment, the method for producing a reflective mask by using photolithography is described by taking, as an example, a case where the reflective mask blank 10 shown in FIG. 1 is used.

First, a resist film (not shown) is formed on the outermost surface (the absorber film 14, which is the uppermost layer of the pattern film 15) of the reflective mask blank 10 shown in FIG. 1. The resist film can have a thickness of, for example, 100 nm. Next, a desired pattern is drawn (exposed) on the resist film, and then developing and rinsing are performed to form a predetermined resist pattern (not shown).

Next, dry etching is performed on the pattern film 15 (absorber film 14) using the resist pattern (not shown) as a mask and an etching gas containing a fluorine-based gas such as $SF_6$, to form a pattern (not shown). After the pattern formation, the resist pattern (not shown) is removed.

Here, an etching rate for the pattern film 15 (absorber film 14) depends on conditions such as the material forming the pattern film 15 (absorber film 14) and the etching gas. Since the pattern film 15 (absorber film 14) is made of a multilayer film including different materials, the etching conditions such as the etching rate and the etching gas may vary for each layer of different materials.

With the above, a pattern is formed. In the case where the pattern film 15 (absorber film 14) made of a multilayer film can be continuously etched by dry etching using one etching gas, the effect of simplifying the process can be obtained. Next, wet cleaning is performed using an acidic or alkaline aqueous solution to obtain a reflective mask for EUV lithography that has achieved a high reflectance.

Note that, as the etching gas, in addition to $SF_6$, fluorine-based gases such as $CHF_3$, $CF_4$, $C_2F_6$, $C_3F_6$, $C_4F_6$, $C_4F_8$, $CH_2F_2$, $CH_3F$, $C_3F_8$, and F, and a mixed gas containing these fluorine gases and $O_2$ in a predetermined ratio can be used. When etching the pattern film 15 (absorber film 14) made of a multilayer film, other gases may be used as long as they are useful for etching. Examples of other gases include at least one or more selected from the group consisting of chlorine-based gases such as $Cl_2$, $SiCl_4$, $CHCl_3$, $CCl_4$, and $BCl_3$, and a mixed gas thereof, a mixed gas containing a chlorine-based gas and He in a predetermined ratio, a mixed gas containing a chlorine-based gas and Ar in a predetermined ratio, a halogen gas containing at least one selected from a fluorine gas, a chlorine gas, a bromine gas, and an iodine gas, and a hydrogen halide gas. Further examples of the other gases include a mixed gas containing these gases and an oxygen gas.

As described above, the following configurations are disclosed in the present description.

<1> A reflective mask blank, which is a binary reflective mask blank, including, in order: a substrate; a multilayer reflective film configured to reflect EUV light; and a pattern film, in which the pattern film has a laminated structure having a total of L layers each having a different refractive index (where L is a natural number of 2 or more), and when an absorption coefficient of an i-th layer in the pattern film from a side opposite to the substrate is defined as $k_i$, a thickness of the i-th layer in the pattern film from the side opposite to the substrate is defined as $d_i$ (nm), a total thickness of the pattern film is defined as d, an exposure wavelength is defined as $\lambda$ (nm), and $P_i$ is defined as $1-\exp(-2\pi/\lambda \cdot d_i k_i)$, the following formula (1) is satisfied.

[Math. 10]

$$\sum_{i=1}^{L} (P_i/d) > 0.0120 \tag{1}$$

<2> The reflective mask blank according to the above <1>, in which when a reflection amplitude of the i-th layer in the pattern film from the side opposite to the substrate is defined as $r_i$, the following formula (2) is satisfied.

[Math. 11]

$$\sum_{i=1}^{L} (r_i) \geq 0.080 \tag{2}$$

<3> The reflective mask blank according to the above <1> or <2>, in which an outermost layer in the pattern film, which is the first layer from the side opposite to the substrate, has a refractive index $n_1$ of 0.950 or less.

<4> The reflective mask blank according to any one of the above <1> to <3>, in which at least one of differences $|\Delta k|$ in absorption coefficient k between two adjacent layers in the pattern film is 0.0200 or more.

<5> The reflective mask blank according to any one of the above <1> to <4>, in which when a refractive index of the i-th layer in the pattern film from the side opposite to the substrate is defined as $n_i$, a thickness $d_1$ of the outermost layer in the pattern film, which is the first layer from the side opposite to the substrate, satisfies the following formula (3).

$$|(\lambda/4n_1 + \lambda/2n_1 * x) - d_1| < 2.50 \quad (3)$$

In the formula (3), x is an integer of 0 or more.

<6> The reflective mask blank according to any one of the above <1> to <5>, in which the pattern film has a reflectance of 1.3% or less.

<7> The reflective mask blank according to any one of the above <1> to <6>, in which the pattern film has a reflectance of 1% or less.

<8> The reflective mask blank according to any one of the above <1> to <7>, in which the pattern film has a total thickness d of 45 nm or less.

<9> The reflective mask blank according to any one of the above <1> to <8>, further including a protective film between the multilayer reflective film and the pattern film.

<10> A reflective mask including: a pattern formed by patterning the pattern film in the reflective mask blank according to any one of the above <1> to <9>.

<11> A method for producing a reflective mask including patterning the pattern film in the reflective mask blank according to any one of the above <1> to <9>.

EXAMPLES

Hereinafter, the present invention is described in detail with reference to Examples. However, the present invention is not limited to the following Examples.

Examples 1 to 3 and Comparative Examples and Examples 4 to 9 are Inventive Examples.

Example 1

A reflective mask blank in Example 1 includes a substrate, a multilayer reflective film formed on the substrate, a protective film formed on the multilayer reflective film, and an absorber film as a pattern film formed on the protective film.

A SiO$_2$—TiO$_2$-based glass substrate (thickness: 6.3 mm) was selected as the substrate, a laminated structure (thickness: 272 nm) in which a silicon film (thickness: 4.5 nm) and a molybdenum film (thickness: 2.3 nm) were alternately laminated to a number of repeating unit of 40 was selected as the multilayer reflective film, a ruthenium (Ru) film (thickness: 2.5 nm) was selected as the protective film, and a laminated structure (L=2) including a tantalum nitride (TaN) film (thickness $d_2$: 37.0 nm) and a ruthenium (Ru) film (thickness $d_1$: 3.3 nm) was selected as the pattern film (absorber film) (thickness d of the pattern film: 40.3 nm). Note that, the substrate side of the absorber film is a tantalum nitride (TaN) film, and the side opposite to the substrate of the absorber film is a ruthenium (Ru) film. Note that, as the refractive index $n_1$ and the absorption coefficient $k_1$ of the ruthenium film, numerical values at a wavelength of 13.5 nm, i.e., $(n_1, k_1)=(0.886, 0.017)$ were used, and as the refractive index $n_2$ and the absorption coefficient $k_2$ of the tantalum nitride (TaN) film, numerical values at a wavelength of 13.5 nm, i.e., $(n_2, k_2)=(0.947, 0.031)$ were used.

As a result, the left side of the formula (1) was 0.0109, the left side of the formula (2) was 0.094, and the left side of the formula (3) was 0.52 (where x=0) (Table 1).

Figure 2:
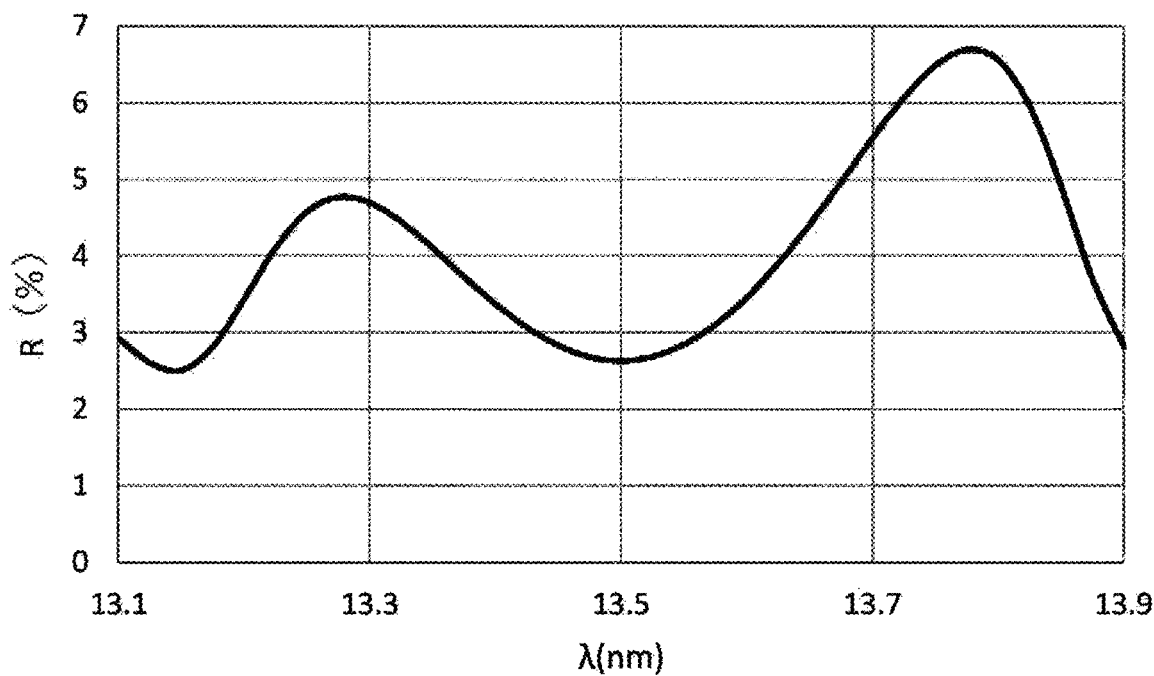
FIG. 2 is a graph showing a relationship between an exposure wavelength k and a reflectance R for a reflective mask blank in Example 1 in which a pattern film has a two-layer structure including a TaN film (thickness $d_2$ on a substrate side: 37.0 nm) and a Ru film (thickness $d_1$ on a side opposite to the substrate: 3.3 nm).

FIG. 2 is a graph showing a relationship between the exposure wavelength k and the reflectance R for the reflective mask blank in Example 1 in which the pattern film has a two-layer structure including a TaN film (thickness $d_2$ on the substrate side: 37.0 nm) and a Ru film (thickness $d_1$ on the side opposite to the substrate: 3.3 nm). The reflectance of the pattern film at a wavelength of 13.5 nm was 2.62% (Table 1). FIG. 2 was obtained by performing an optical multilayer film simulation.

Example 2

Example 2 was obtained in the same manner in Example 1 except that a laminated structure (L=2) including a tantalum nitride (TaN) film (thickness $d_2$: 44.0 nm) and a ruthenium (Ru) film (thickness $d_1$: 3.8 nm) was selected as the pattern film (absorber film) (thickness d of the pattern film: 47.8 nm), instead of the laminated structure (L=2) including a tantalum nitride (TaN) film (thickness $d_2$: 37.0 nm) and a ruthenium (Ru) film (thickness $d_1$: 3.3 nm) selected as the pattern film (absorber film) (thickness d of the pattern film: 40.3 nm) in Example 1.

As a result, the left side of the formula (1) was 0.0104, the left side of the formula (2) was 0.094, and the left side of the formula (3) was 0.02 (where x=0) (Table 1).

Figure 3:
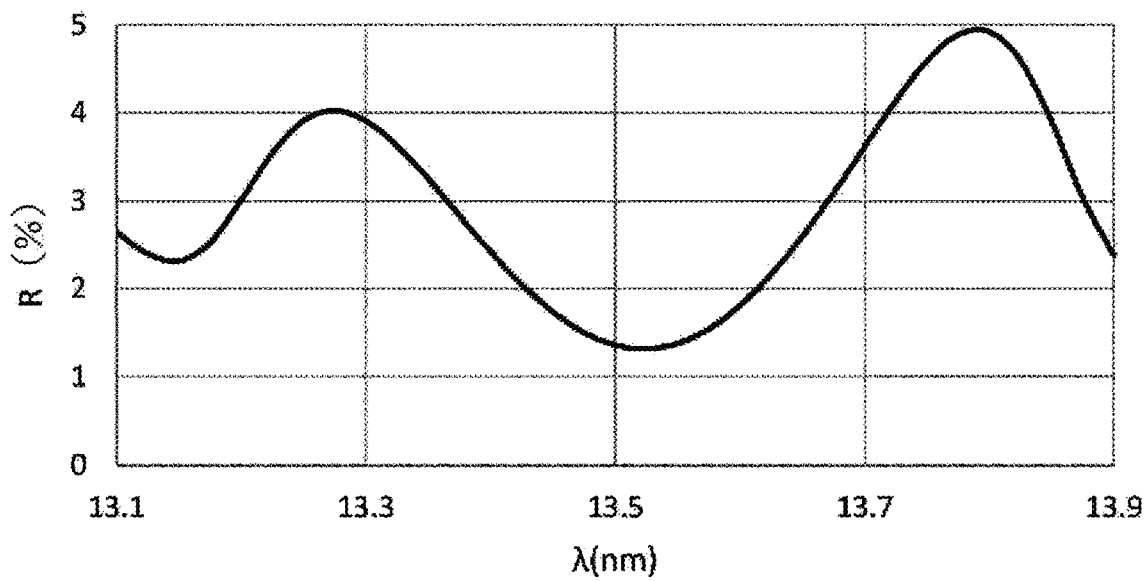
FIG. 3 is a graph showing a relationship between the exposure wavelength k and the reflectance R for a reflective mask blank in Example 2 in which a pattern film has a two-layer structure including a TaN film (thickness $d_2$ on the substrate side: 44.0 nm) and a Ru film (thickness $d_1$ on the side opposite to the substrate: 3.8 nm).

FIG. 3 is a graph showing a relationship between the exposure wavelength k and the reflectance R for the reflective mask blank in Example 2 in which the pattern film has a two-layer structure including a TaN film (thickness $d_2$ on the substrate side: 44.0 nm) and a Ru film (thickness $d_1$ on the side opposite to the substrate: 3.8 nm). The reflectance of the pattern film at a wavelength of 13.5 nm was 1.36% (Table 1). FIG. 3 was obtained by performing an optical multilayer film simulation.

Example 3

Example 3 was obtained in the same manner in Example 1 except that a laminated structure (L=3) including a TaN film (thickness $d_3$ on the substrate side: 32.6 nm), a SiN film (thickness $d_2$: 2.6 nm), and a TaN film (thickness $d_1$ on the side opposite to the substrate: 4.5 nm) was selected as the pattern film (absorber film) (thickness d of the pattern film: 39.7 nm), instead of the laminated structure (L=2) including a tantalum nitride (TaN) film (thickness $d_2$: 37.0 nm) and a ruthenium (Ru) film (thickness $d_1$: 3.3 nm) selected as the pattern film (absorber film) (thickness d of the pattern film: 40.3 nm) in Example 1. Note that, as the refractive index $n_2$ and the absorption coefficient $k_2$ of the SiN film, numerical values at a wavelength of 13.5 nm, i.e., $(n_2, k_2)=(0.973, 0.009)$ were used.

As a result, the left side of the formula (1) was 0.0113, the left side of the formula (2) was 0.054, and the left side of the formula (3) was 0.93 (where x=0) (Table 1).

Figure 4:
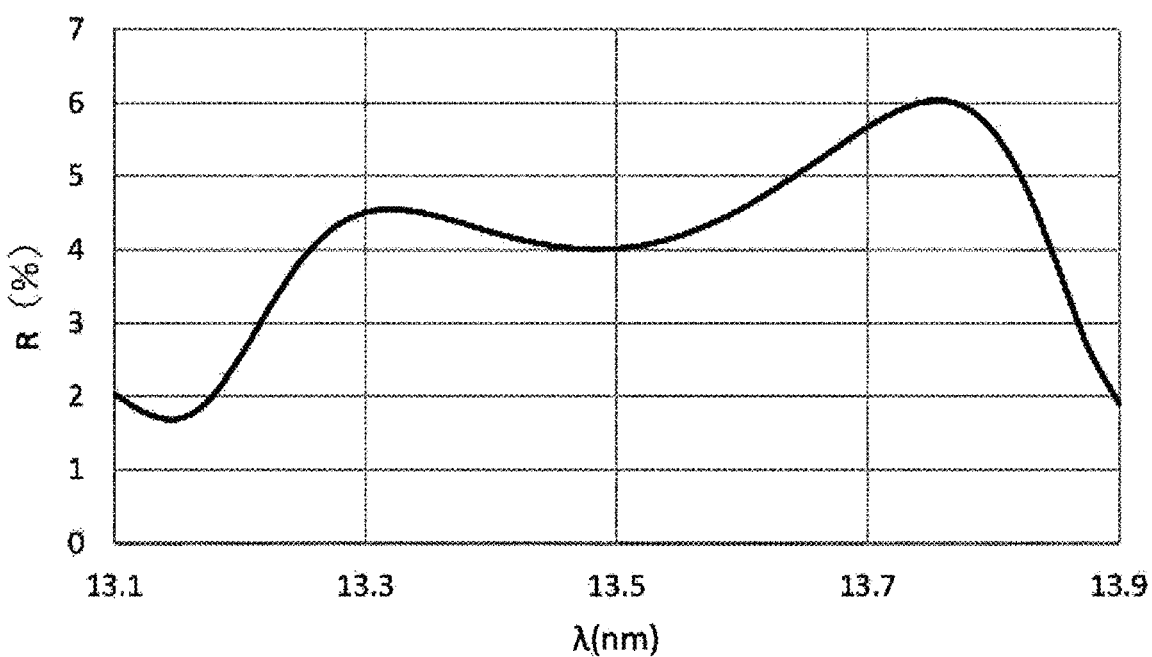
FIG. 4 is a graph showing a relationship between the exposure wavelength k and the reflectance R for a reflective mask blank in Example 3 in which a pattern film has a three-layer structure including a TaN film (thickness $d_3$ on the substrate side: 32.6 nm), a SiN film (thickness $d_2$: 2.6 nm), and a TaN film (thickness $d_1$ on the side opposite to the substrate: 4.5 nm).

FIG. 4 is a graph showing a relationship between the exposure wavelength k and the reflectance R for the reflective mask blank in Example 3 in which the pattern film has a three-layer structure including a TaN film (thickness $d_3$ on the substrate side: 32.6 nm), a SiN film (thickness $d_2$: 2.6 nm), and a TaN film (thickness $d_1$ on the side opposite to the substrate: 4.5 nm). The reflectance of the pattern film at a wavelength of 13.5 nm was 4.01% (Table 1). FIG. 4 was obtained by performing an optical multilayer film simulation.

Example 4

Example 4 was obtained in the same manner in Example 1 except that a laminated structure (L=2) including a TaN film (thickness $d_2$ on the substrate side: 28.4 nm) and a Pt film (thickness $d_1$ on the side opposite to the substrate: 12.1 nm) was selected as the pattern film (absorber film) (thickness d of the pattern film: 40.5 nm), instead of the laminated structure (L=2) including a tantalum nitride (TaN) film (thickness $d_2$: 37.0 nm) and a ruthenium (Ru) film (thickness $d_1$: 3.3 nm) selected as the pattern film (absorber film) (thickness d of the pattern film: 40.3 nm) in Example 1. Note that, as the refractive index $n_1$ and the absorption coefficient $k_1$ of the Pt film, numerical values at a wavelength of 13.5 nm, i.e., $(n_1, k_1)$=(0.891, 0.060) were used.

As a result, the left side of the formula (1) was 0.0153, the left side of the formula (2) was 0.088, and the left side of the formula (3) was 0.71 (where x=1) (Table 1).

Figure 5:
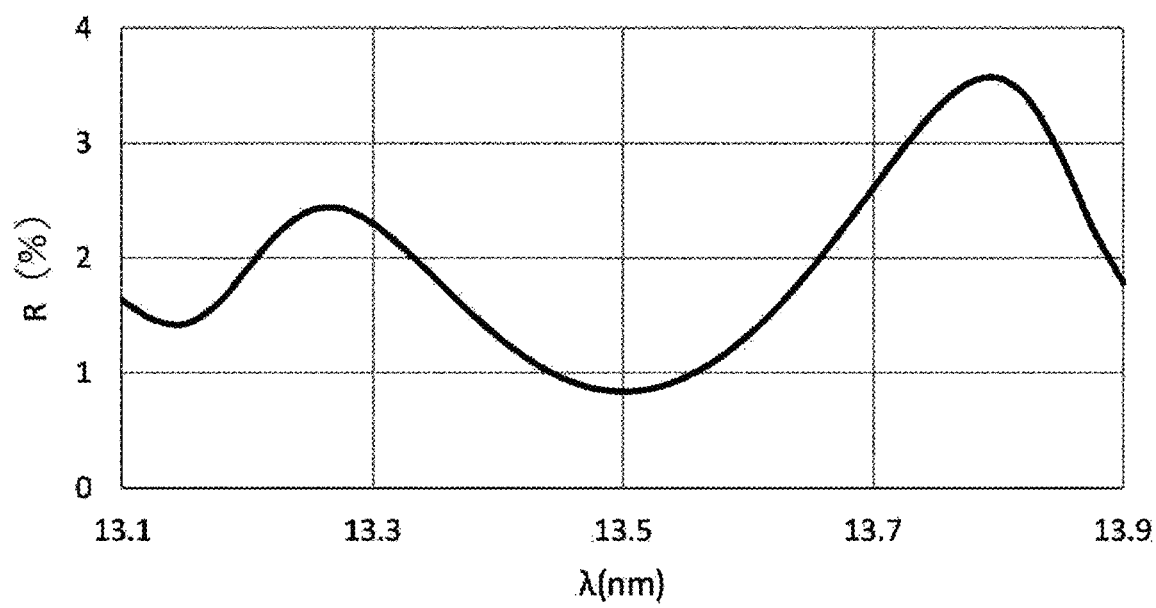
FIG. 5 is a graph showing a relationship between the exposure wavelength k and the reflectance R for a reflective mask blank in Example 4 in which a pattern film has a two-layer structure including a TaN film (thickness $d_2$ on the substrate side: 28.4 nm) and a Pt film (thickness $d_1$ on the side opposite to the substrate: 12.1 nm).

FIG. 5 is a graph showing a relationship between the exposure wavelength k and the reflectance R for the reflective mask blank in Example 4 in which the pattern film has a two-layer structure including a TaN film (thickness $d_2$ on the substrate side: 28.4 nm) and a Pt film (thickness $d_1$ on the side opposite to the substrate: 12.1 nm). The reflectance of the pattern film at a wavelength of 13.5 nm was 0.84% (Table 1). FIG. 5 was obtained by performing an optical multilayer film simulation.

Example 5

Example 5 was obtained in the same manner in Example 1 except that a laminated structure (L=2) including a TaN film (thickness $d_2$ on the substrate side: 27.3 nm) and a Pt film (thickness $d_1$ on the side opposite to the substrate: 13.4 nm) was selected as the pattern film (absorber film) (thickness d of the pattern film: 40.7 nm), instead of the laminated structure (L=2) including a tantalum nitride (TaN) film (thickness $d_2$: 37.0 nm) and a ruthenium (Ru) film (thickness $d_1$: 3.3 nm) selected as the pattern film (absorber film) (thickness d of the pattern film: 40.3 nm) in Example 1.

Figure 6:
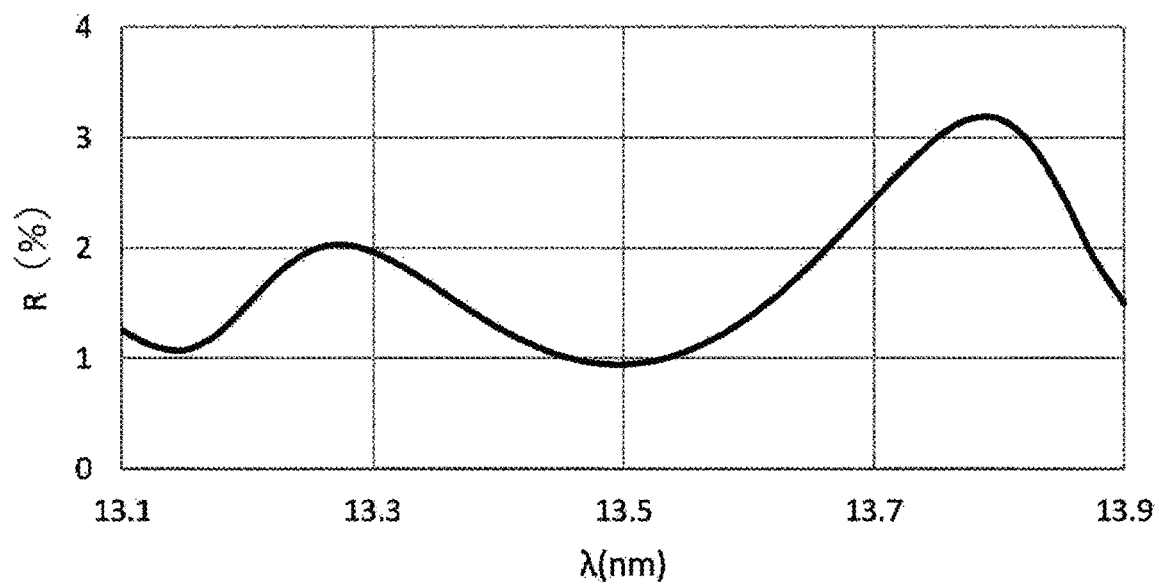
FIG. 6 is a graph showing a relationship between the exposure wavelength k and the reflectance R for a reflective mask blank in Example 5 in which a pattern film has a two-layer structure including a TaN film (thickness $d_2$ on the substrate side: 27.3 nm) and a Pt film (thickness $d_1$ on the side opposite to the substrate: 13.4 nm).

As a result, the left side of the formula (1) was 0.0156, the left side of the formula (2) was 0.088, and the left side of the formula (3) was 2.01 (where x=1) (Table 1). FIG. 6 is a graph showing a relationship between the exposure wavelength k and the reflectance R for the reflective mask blank in Example 5 in which the pattern film has a two-layer structure including a TaN film (thickness $d_2$ on the substrate side: 27.3 nm) and a Pt film (thickness $d_1$ on the side opposite to the substrate: 13.4 nm). The reflectance of the pattern film at a wavelength of 13.5 nm was 0.94% (Table 1). FIG. 6 was obtained by performing an optical multilayer film simulation.

Example 6

Example 6 was obtained in the same manner in Example 1 except that a laminated structure (L=2) including a TaN film (thickness $d_2$ on the substrate side: 28.2 nm) and a Pt film (thickness $d_1$ on the side opposite to the substrate: 12.4 nm) was selected as the pattern film (absorber film) (thickness d of the pattern film: 40.6 nm), instead of the laminated structure (L=2) including a tantalum nitride (TaN) film (thickness $d_2$: 37.0 nm) and a ruthenium (Ru) film (thickness $d_1$: 3.3 nm) selected as the pattern film (absorber film) (thickness d of the pattern film: 40.3 nm) in Example 1.

As a result, the left side of the formula (1) was 0.0154, the left side of the formula (2) was 0.088, and the left side of the formula (3) was 1.01 (where x=1) (Table 1).

Figure 7:
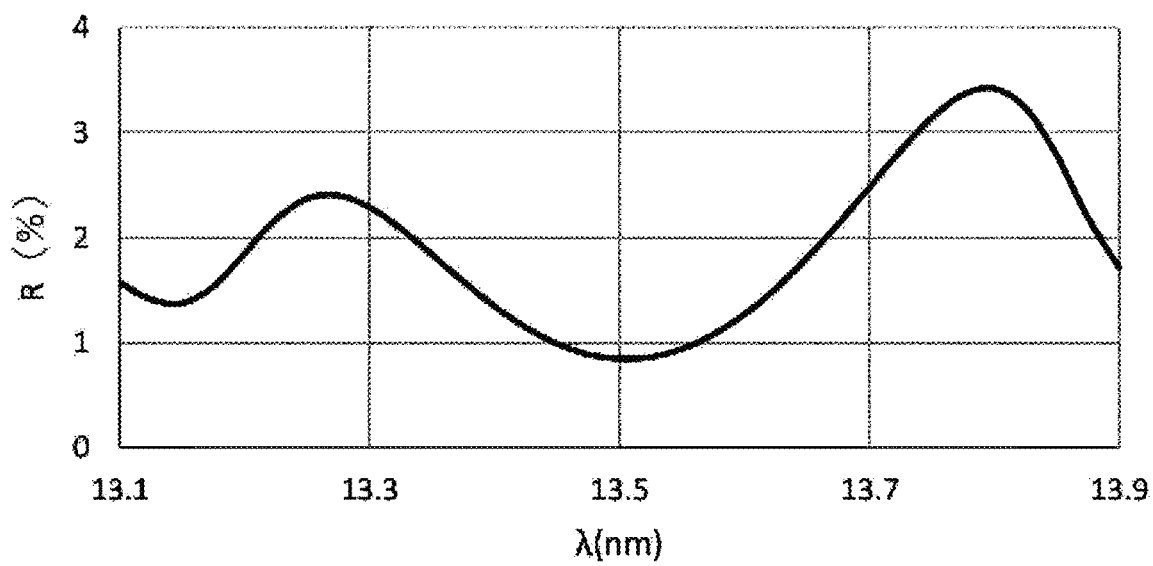
FIG. 7 is a graph showing a relationship between the exposure wavelength k and the reflectance R for a reflective mask blank in Example 6 in which a pattern film has a two-layer structure including a TaN film (thickness $d_2$ on the substrate side: 28.2 nm) and a Pt film (thickness $d_1$ on the side opposite to the substrate: 12.4 nm).

FIG. 7 is a graph showing a relationship between the exposure wavelength k and the reflectance R for the reflective mask blank in Example 6 in which the pattern film has a two-layer structure including a TaN film (thickness $d_2$ on the substrate side: 28.2 nm) and a Pt film (thickness $d_1$ on the side opposite to the substrate: 12.4 nm). The reflectance of the pattern film at a wavelength of 13.5 nm was 0.85% (Table 1). FIG. 7 was obtained by performing an optical multilayer film simulation.

Example 7

Example 7 was obtained in the same manner in Example 1 except that a laminated structure (L=2) including a Cr film (thickness $d_2$ on the substrate side: 38.0 nm) and a Ru film (thickness $d_1$ on the side opposite to the substrate: 2.8 nm) was selected as the pattern film (absorber film) (thickness d of the pattern film: 40.8 nm), instead of the laminated structure (L=2) including a tantalum nitride (TaN) film (thickness $d_2$: 37.0 nm) and a ruthenium (Ru) film (thickness $d_1$: 3.3 nm) selected as the pattern film (absorber film) (thickness d of the pattern film: 40.3 nm) in Example 1. Note that, as the refractive index $n_2$ and the absorption coefficient $k_2$ of the Cr film, numerical values at a wavelength of 13.5 nm, i.e., $(n_2, k_2)$=(0.932, 0.039) were used.

As a result, the left side of the formula (1) was 0.0127, the left side of the formula (2) was 0.086, and the left side of the formula (3) was 1.02 (where x=0) (Table 1).

Figure 8:
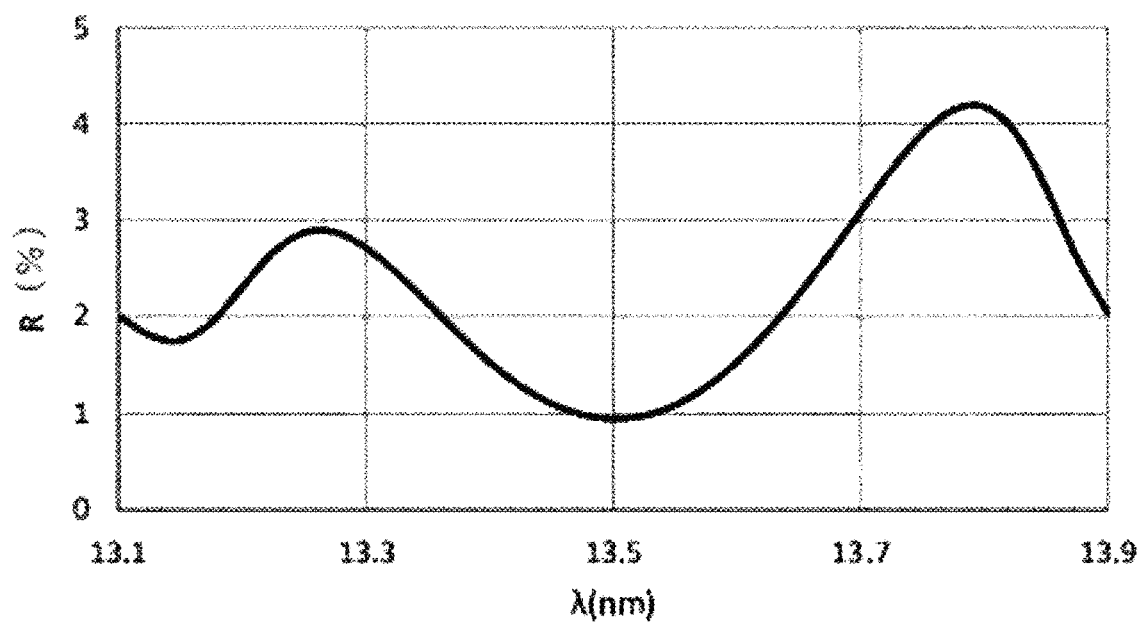
FIG. 8 is a graph showing a relationship between the exposure wavelength k and the reflectance R for a reflective mask blank in Example 7 in which a pattern film has a two-layer structure including a Cr film (thickness $d_2$ on the substrate side: 38.0 nm) and a Ru film (thickness $d_1$ on the side opposite to the substrate: 2.8 nm).

FIG. 8 is a graph showing a relationship between the exposure wavelength k and the reflectance R for the reflective mask blank in Example 7 in which the pattern film has a two-layer structure including a Cr film (thickness $d_2$ on the substrate side: 38 nm) and a Ru film (thickness $d_1$ on the side opposite to the substrate: 2.8 nm). The reflectance of the pattern film at a wavelength of 13.5 nm was 0.95% (Table 1). FIG. 8 was obtained by performing an optical multilayer film simulation.

Example 8

Example 8 was obtained in the same manner in Example 1 except that a laminated structure (L=3) including a Cr film (thickness $d_3$ on the substrate side: 33.1 nm), a Si film (thickness $d_2$: 3.1 nm), and a Cr film (thickness $d_1$ on the side opposite to the substrate: 3.9 nm) was selected as the pattern film (absorber film) (thickness d of the pattern film: 40.1 nm), instead of the laminated structure (L=2) including a tantalum nitride (TaN) film (thickness $d_2$: 37.0 nm) and a ruthenium (Ru) film (thickness $d_1$: 3.3 nm) selected as the pattern film (absorber film) (thickness d of the pattern film: 40.3 nm) in Example 1. As the refractive index $n_2$ and the absorption coefficient $k_2$ of the Si film, numerical values at a wavelength of 13.5 nm, i.e., $(n_2, k_2)$=(0.999, 0.002) were used.

As a result, the left side of the formula (1) was 0.0130, the left side of the formula (2) was 0.105, and the left side of the formula (3) was 0.27 (where x=0) (Table 1).

Figure 9:
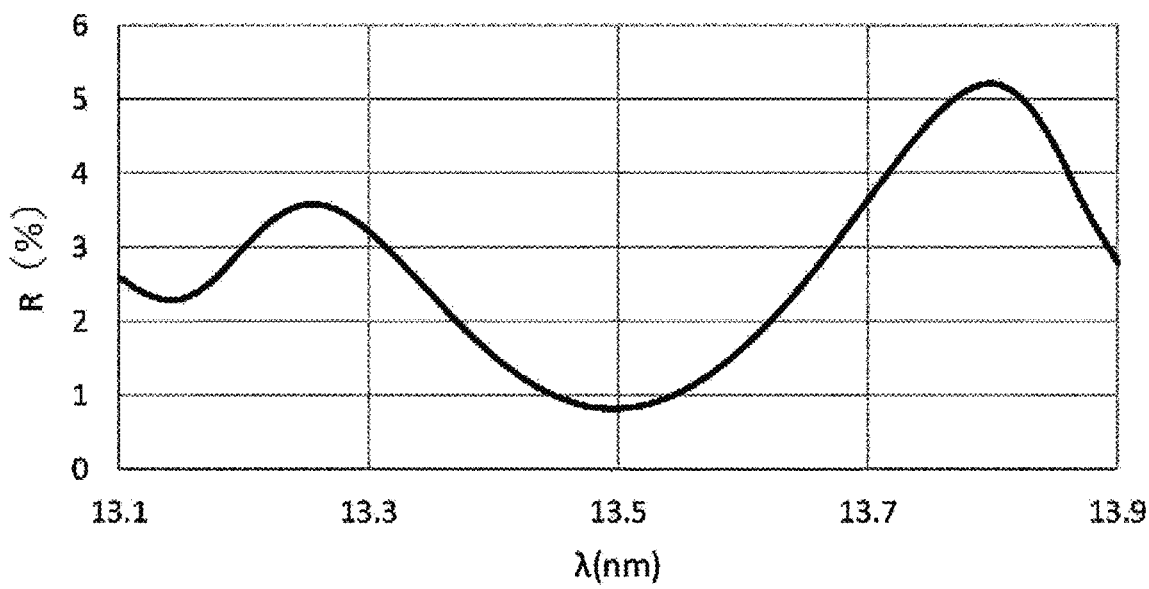
FIG. 9 is a graph showing a relationship between the exposure wavelength k and the reflectance R for a reflective mask blank in Example 8 in which a pattern film has a three-layer structure including a Cr film (thickness $d_3$ on the substrate side: 33.1 nm), a Si film (thickness $d_2$: 3.1 nm), and a Cr film (thickness $d_1$ on the side opposite to the substrate: 3.9 nm).

FIG. 9 is a graph showing a relationship between the exposure wavelength k and the reflectance R for the reflective mask blank in Example 8 in which the pattern film has a three-layer structure including a Cr film (thickness $d_3$ on the substrate side: 33.1 nm), a Si film (thickness $d_2$: 3.1 nm), and a Cr film (thickness $d_1$ on the side opposite to the substrate: 3.9 nm). The reflectance of the pattern film at a wavelength of 13.5 nm was 0.82% (Table 1). FIG. 9 was obtained by performing an optical multilayer film simulation.

Example 9

Figure 10:
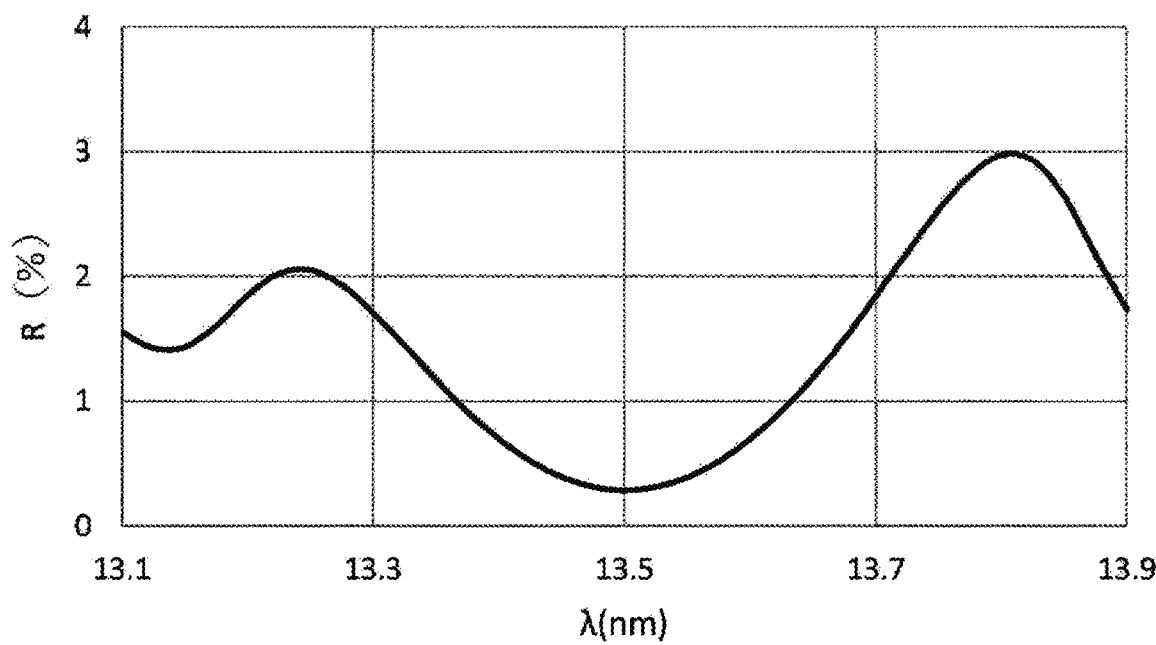
FIG. 10 is a graph showing a relationship between the exposure wavelength k and the reflectance R for a reflective mask blank in Example 9 in which a pattern film has a two-layer structure including a $SnO_2$ film (thickness $d_2$ on the substrate side: 24.1 nm) and a Ru film (thickness $d_1$ on the side opposite to the substrate: 2.2 nm).

Example 9 was obtained in the same manner in Example 1 except that a laminated structure (L=2) including a $SnO_2$ film (thickness $d_2$ on the substrate side: 24.1 nm) and a Ru film (thickness $d_1$ on the side opposite to the substrate: 2.2 nm). The reflectance of the pattern film at a wavelength of 13.5 nm was 0.29% (Table 1). FIG. 10 was obtained by performing an optical multilayer film simulation.

TABLE 1

|   |   | n | k | Thickness (nm) | Formula (1) | Formula (2) | Formula (3) | Reflectance R (%) |
|---|---|---|---|---|---|---|---|---|
| Example 1 | Ru (side opposite to substrate) | 0.886 | 0.017 | 3.3 | 0.0109 | 0.094 | 0.52 | 2.62 |
|  | TaN (substrate side) | 0.947 | 0.031 | 37.0 |  |  |  |  |
|  | Total | — | — | 40.3 |  |  |  |  |
| Example 2 | Ru (side opposite to substrate) | 0.886 | 0.017 | 3.8 | 0.0104 | 0.094 | 0.02 | 1.36 |
|  | TaN (substrate side) | 0.947 | 0.031 | 44.0 |  |  |  |  |
|  | Total | — | — | 47.8 |  |  |  |  |
| Example 3 | TaN (side opposite to substrate) | 0.947 | 0.031 | 4.5 | 0.0113 | 0.054 | 0.93 | 4.01 |
|  | SiN | 0.973 | 0.009 | 2.6 |  |  |  |  |
|  | TaN (substrate side) | 0.947 | 0.031 | 32.6 |  |  |  |  |
|  | Total | — | — | 39.7 |  |  |  |  |
| Example 4 | Pt (side opposite to substrate) | 0.891 | 0.060 | 12.1 | 0.0153 | 0.088 | 0.71 | 0.84 |
|  | TaN (substrate side) | 0.947 | 0.031 | 28.4 |  |  |  |  |
|  | Total | — | — | 40.5 |  |  |  |  |
| Example 5 | Pt (side opposite to substrate) | 0.891 | 0.060 | 13.4 | 0.0156 | 0.088 | 2.01 | 0.94 |
|  | TaN (substrate side) | 0.947 | 0.031 | 27.3 |  |  |  |  |
|  | Total | — | — | 40.7 |  |  |  |  |
| Example 6 | Pt (side opposite to substrate) | 0.891 | 0.060 | 12.4 | 0.0154 | 0.088 | 1.01 | 0.85 |
|  | TaN (substrate side) | 0.947 | 0.031 | 28.2 |  |  |  |  |
|  | Total | — | — | 40.6 |  |  |  |  |
| Example 7 | Ru (side opposite to substrate) | 0.886 | 0.017 | 2.8 | 0.0127 | 0.086 | 1.02 | 0.95 |
|  | Cr (substrate side) | 0.932 | 0.039 | 38.0 |  |  |  |  |
|  | Total | — | — | 40.8 |  |  |  |  |
| Example 8 | Cr (side opposite to substrate) | 0.932 | 0.039 | 3.9 | 0.0130 | 0.105 | 0.27 | 0.82 |
|  | Si | 0.999 | 0.002 | 3.1 |  |  |  |  |
|  | Cr (substrate side) | 0.932 | 0.039 | 33.1 |  |  |  |  |
|  | Total | — | — | 40.1 |  |  |  |  |
| Example 9 | Ru (side opposite to substrate) | 0.886 | 0.017 | 2.2 | 0.0213 | 0.082 | 1.62 | 0.29 |
|  | SnO2 (substrate side) | 0.925 | 0.070 | 24.1 |  |  |  |  |
|  | Total | — | — | 26.3 |  |  |  |  | film (thickness $d_2$ on the substrate side: 24.1 nm) and a Ru film (thickness $d_1$: 2.2 nm) was selected as the pattern film (absorber film) (thickness d of the pattern film: 26.3 nm), instead of the laminated structure (L=2) including a tantalum nitride (TaN) film (thickness $d_2$: 37 nm) and a ruthenium (Ru) film (thickness $d_1$: 3.3 nm) selected as the pattern film (absorber film) (thickness d of the pattern film: 40.3 nm) in Example 1.

As a result, the left side of the formula (1) was 0.0213, the left side of the formula (2) was 0.082, and the left side of the formula (3) was 1.62 (where x=0) (Table 1).

FIG. 10 is a graph showing a relationship between the exposure wavelength λ and the reflectance R for the reflective mask blank in Example 9 in which the pattern film has a two-layer structure including a $SnO_2$ film (thickness $d_2$ on the substrate side: 24.1 nm) and a Ru film (thickness $d_1$ on the side opposite to the substrate: 2.2 nm). The reflectance of the pattern film at a wavelength of 13.5 nm was 0.29% (Table 1). FIG. 10 was obtained by performing an optical multilayer film simulation.

As seen from Table 1, the reflective mask blanks satisfying the formula (1) (Example 4 to Example 9) have a sufficiently small reflectance of the pattern film (reflectance: 0.29% to 0.95%) while having a small thickness of the pattern film. On the other hand, the reflective mask blanks not satisfying the formula (1) (Example 1 to Example 3) cannot have a sufficiently small reflectance of the pattern film (reflectance: 1.36% to 4.01%).

Although the present invention has been described in detail with reference to specific embodiments, it is apparent to those skilled in the art that various changes and modifications can be made without departing from the spirit and scope of the present invention.

REFERENCE SIGNS LIST 10 reflective mask blank
11 substrate
12 multilayer reflective film
13 protective film
14 absorber film
15 pattern film

The invention claimed is:

1. A reflective mask blank, which is a binary reflective mask blank, comprising, in order:
   a substrate;
   a multilayer reflective film configured to reflect EUV light; and
   a pattern film,
   wherein the pattern film has a laminated structure comprising a total of L layers each having a different refractive index, wherein L is a natural number of 2 or more, and
   when an absorption coefficient of an i-th layer in the pattern film from a side opposite to the substrate is defined as $k_i$, a thickness of the i-th layer in the pattern film from the side opposite to the substrate is defined as $d_i$ (nm), a total thickness of the pattern film is defined as d, an exposure wavelength is defined as $\lambda$ (nm), and $P_i$ is defined as $1-\exp(-2\pi/\lambda * d_i k_i)$, the following formula (1) is satisfied:

$$\sum_{i=1}^{L}(P_i/d) > 0.0120. \tag{1}$$

2. The reflective mask blank according to claim 1, wherein when a reflection amplitude of the i-th layer in the pattern film from the side opposite to the substrate is defined as $r_i$, the following formula (2) is satisfied:

$$\sum_{i=1}^{L}(r_i) \geq 0.080. \tag{2}$$

3. The reflective mask blank according to claim 1, wherein an outermost layer in the pattern film, which is the first layer from the side opposite to the substrate, has a refractive index $n_1$ of 0.950 or less.

4. The reflective mask blank according to claim 1, wherein at least one of differences $|\Delta k|$ in absorption coefficient k between two adjacent layers in the pattern film is 0.0200 or more.

5. The reflective mask blank according to claim 1, wherein when a refractive index of the i-th layer in the pattern film from the side opposite to the substrate is defined as $n_i$, a thickness $d_1$ of an outermost layer in the pattern film, which is the first layer from the side opposite to the substrate, satisfies the following formula (3):

$$|(\lambda/4n_1+\lambda/2n_1 * x)-d_1|<2.50 \tag{3},$$

wherein in the formula (3), x is an integer of 0 or more.

6. The reflective mask blank according to claim 1, wherein the pattern film has a reflectance of 1.3% or less.

7. The reflective mask blank according to claim 1, wherein the pattern film has a reflectance of 1% or less.

8. The reflective mask blank according to claim 1, wherein the pattern film has a total thickness d of 45 nm or less.

9. The reflective mask blank according to claim 1, further comprising a protective film between the multilayer reflective film and the pattern film.

10. A reflective mask comprising a pattern formed by patterning the pattern film in the reflective mask blank according to claim 1.

11. A method for producing a reflective mask comprising patterning the pattern film in the reflective mask blank according to claim 1.

* * * * *